United States Patent [19]

Leipold et al.

[11] Patent Number: 5,086,364
[45] Date of Patent: Feb. 4, 1992

[54] CIRCUITRY FOR DETECTING A SHORT CIRCUIT OF A LOAD IN SERIES WITH AN FET

[75] Inventors: Ludwig Leipold; Rainald Sander; Jenoë Tihanyi; Roland Weber, all of Munich, Fed. Rep. of Germany

[73] Assignee: Siemens Aktiengesellschaft, Berlin and Munich, Fed. Rep. of Germany

[21] Appl. No.: 657,291

[22] Filed: Feb. 19, 1991

Related U.S. Application Data

[63] Continuation of Ser. No. 382,524, Jul. 20, 1989, abandoned.

[30] Foreign Application Priority Data

Jul. 27, 1988 [DE] Fed. Rep. of Germany ....... 3825514

[51] Int. Cl.$^5$ ............................................. H02H 3/20
[52] U.S. Cl. ......................................... 361/18; 361/49; 361/56; 361/91; 363/50
[58] Field of Search ....................... 361/18, 42, 45, 56, 361/58, 86, 91, 101, 111, 49; 363/50, 55, 56

[56] References Cited

U.S. PATENT DOCUMENTS

| 4,595,966 | 6/1986 | Huber et al. | 361/93 |
| 4,750,079 | 6/1988 | Fay et al. | 361/103 |
| 4,893,211 | 1/1990 | Bynum et al. | 361/18 |

FOREIGN PATENT DOCUMENTS 61-102816 9/1986 Japan.
8605926 10/1986 PCT Int'l Appl. .

Primary Examiner—Todd E. DeBoer

[57] ABSTRACT

The voltage ($U_{DS}$) on a power MOSFET (1) is compared with a voltage ($U_V$) derived from the sum of the voltages of a Zener diode (3) and the threshold voltage ($U_T$) of a second MOSFET (5) to detect a short circuit in a load (2) in series with the power MOSFET (1). When this total voltage is exceeded, the second MOSFET conducts. Its load current is then evaluated as the short circuit signal.

10 Claims, 2 Drawing Sheets

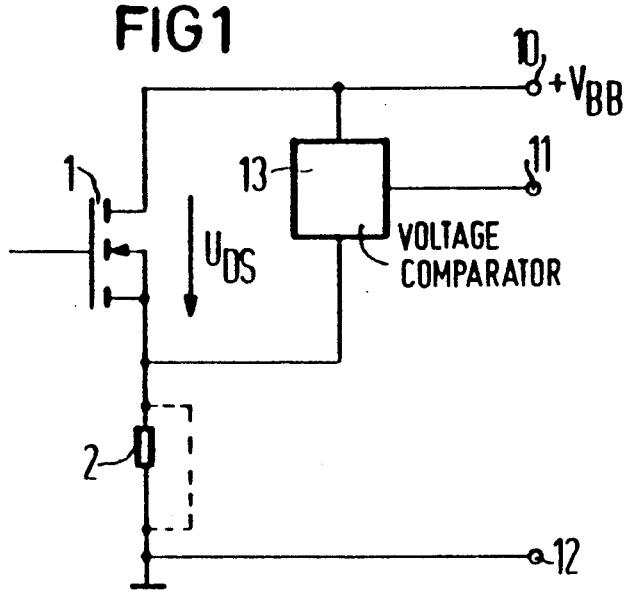
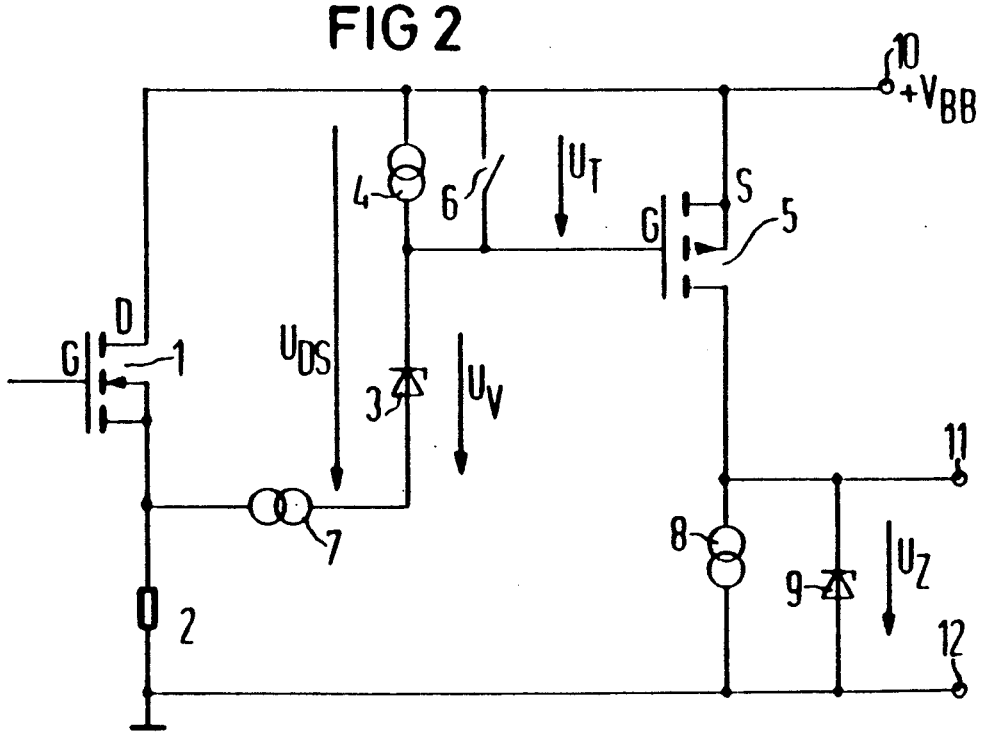

CIRCUITRY FOR DETECTING A SHORT CIRCUIT OF A LOAD IN SERIES WITH AN FET

CROSS-REFERENCE TO RELATED APPLICATION

This is a continuation of Ser. No. 07/382,524 filed July 20, 1989, now abandoned.

BACKGROUND OF THE INVENTION

This invention relates to a circuit arrangement for detecting a short circuit of a load in series with a power MOSFET.

When using power ICs, e.g., in complex wiring systems of motor vehicles, for example, short circuits can occur for various reasons when the load is bridged. In this case the power MOSFET is subjected to a short circuit load on the order of several kW. Conventional methods for detecting overload by determining the temperature of the power MOSFET are not very effective in short circuits because these methods are relatively slow and the MOSFET can be destroyed in the time required for the electronic breaker to respond.

SUMMARY OF THE INVENTION

It is an object of the present invention to provide a circuit arrangement for detecting a short circuit of a load in series with a power MOSFET, so the short circuit can be detected more rapidly.

This object is achieved by means of a voltage comparator connected in series with the source-drain portion of the power MOSFET, so the voltage comparator gives a signal on exceeding a certain voltage that is characteristic of a short circuit in the load.

BRIEF DESCRIPTION OF THE DRAWING

Additional features of the invention and additional objects of the invention will be more readily appreciated and better understood by reference to the following detailed description which should be considered in conjunction with the drawing.

FIG. 1 depicts a circuit according to the principle on which the present invention is based.

FIG. 2 illustrates a more specific example.

DETAILED DESCRIPTION

Figure 3:
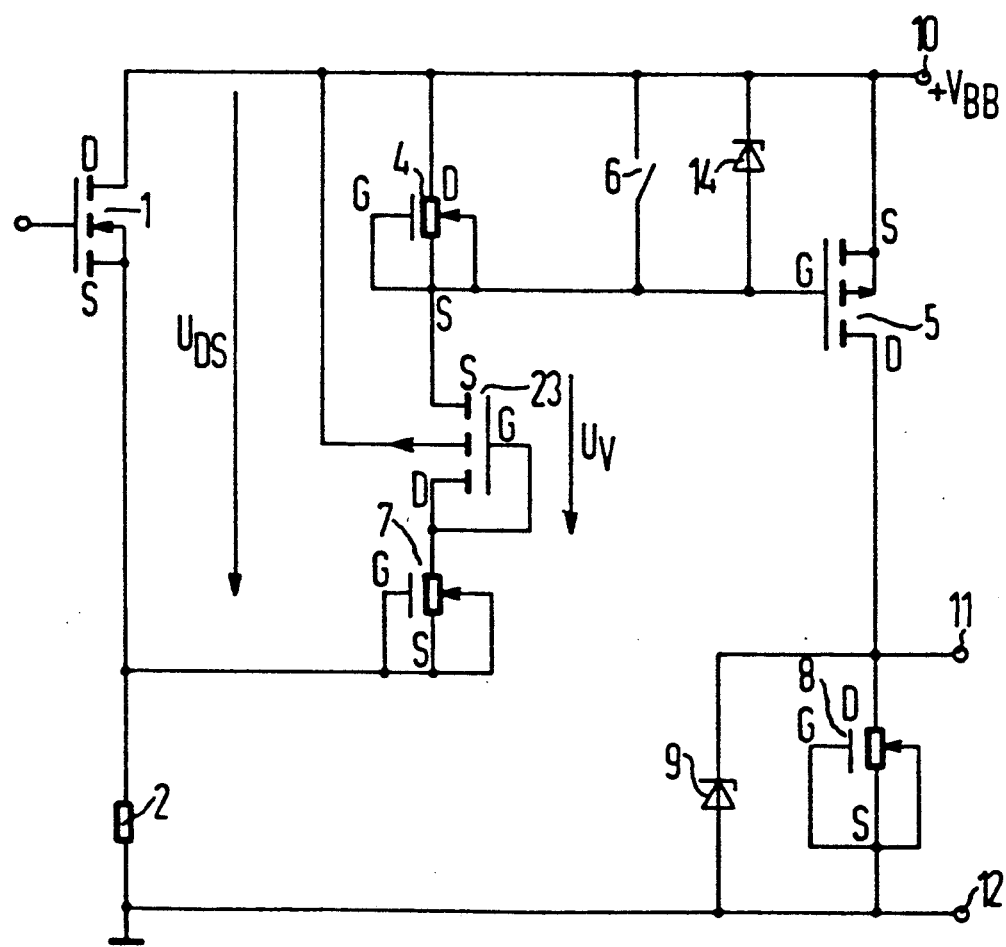
FIG. 3 shows the implementation of the practical example according to FIG. 2 with components suitable for integration.

The circuit according to FIG. 1 shows a power MOSFET 1 which is connected in series to a load 2 at the source end. The series connection of load 2 and MOSFET 1 is connected by way of terminals 10, 12 to a supply voltage $V_{BB}$. If the load 2 is short circuited as indicated by the dotted line connecting the terminals 10, 12, then a high current flows through power MOSFET 1. Thus, the source voltage $U_{DS}$ applied to the MOSFET increases to a value close to the supply voltage. A high current, namely the short circuit current, then flows through the transistor and would normally destroy it within a very short period of time. A voltage comparator 13 is connected in parallel with the drain-source portion of MOSFET 1 and its reference voltage is set at a level that is not hazardous for the transistor but is exceeded upon the occurrence of a short circuit. Such a voltage would be 6 volts, for example, for a power MOSFET. Thus, if a short circuit occurs, the voltage on the transistor increases steeply in comparison with the supply voltage. On reaching a voltage $U_{DS}$ of 6 V, for example, voltage comparator delivers a reference voltage which can be detected as a signal for the short circuit at output 11. This voltage is then used in a circuit that processes logic signals (not shown here) to disconnect power MOSFET 1.

FIG. 2 illustrates the equivalent schematic of voltage comparator 13 which contains a Zener diode 3 connected in series with a current source 4. One terminal of current source 4 is connected to drain terminal D of MOSFET 1 on the one hand and to terminal 10 on the other hand. The other terminal of current source 4 is connected to the Zener diode 3 and to the gate terminal G of a second MOSFET 5. MOSFET 5 is of the opposite channel type from power MOSFET 1. In the version shown here 1 is an n-channel MOSFET and 5 is a p-channel MOSFET. The source terminal S is connected to the drain terminal of MOSFET 1, and its drain terminal D is applied to the other terminal 12 through a load 8.

In normal operation, $U_{DS}$ is so small that the voltage comparator does not deliver any signal. In this case, gate terminal G of MOSFET 5 is practically at the potential $V_{BB}$ through current source 4. It is thus blocked. If the voltage $U_{DS}$ on MOSFET 1 exceeds the total of the Zener voltage of the Zener diode 3 and the threshold voltage $U_T$ of the FET 5, then MOSFET 5 is rendered conducting. Then a current flows from terminal 10 through MOSFET 5 and load 8 to terminal 12. The voltage drop at load 8 can be detected at terminals 11 and 12 as a signal of the short circuit and converted to a signal which cuts off power MOSFET 1.

Load 8 may be a resistor or a power source which can be integrated especially easily. To limit the voltage, there is a Zener diode 9 between output terminals 11 and 12. If MOSFET 5 is rendered conducting, the output voltage is limited to Zener voltage $U_Z$.

If the circuit is not disconnected externally in a state at rest, then it is constantly at supply voltage $V_{BB}$. In the blocked state of power MOSFET 1, a current would thus constantly be flowing through MOSFET 5. This current can be limited, e.g., to a few µA, by suitable dimensioning of the current source which is load 8, but it would constantly signal a short circuit. For this case a switch 6 is provided between gate terminal G and source terminal S of MOSFET 5 so that when power MOSFET 1 is blocked, the switch is closed. To limit the current flowing across switch 6, another current source 7 is provided between the source terminal of MOSFET 1 and the Zener diode 3 or between Zener diode 3 and the connecting point between current source 4 and Zener diode 3. This additional current source limits the current flowing across switch 6, Zener diode 3 and load 2, e.g., to 5 µA. If MOSFET 1 is rendered conducting, switch 6 is opened, e.g., by a logic circuit.

FIG. 3 provides actual devices in an illustrative embodiment of the invention for current sources 4, 7, and 8. These current sources comprise n-channel depletion MOSFETs, whose gate terminals G are each connected electrically to their source terminals S. Zener diode 3 is replaced by a p-channel enhancement MOSFET 23, whose source terminal S is connected to the source terminal of current source 4 and whose drain terminal is connected to the drain terminal of current source 7. The gate terminal of MOSFET 23 is connected to its drain terminal. MOSFET 23 functions here as an MOS diode exhibiting a Zener characteristic. The substrate of MOSFET 23 can be connected in integrated form to the drain terminal 1, designed discretely with the source terminal of 3.

To protect the gate-source capacitance of MOSFET 5, it is connected in parallel with a Zener diode 14.

There has thus been shown and described novel circuitry for detecting a short circuit which fulfills all the objects and advantages sought therefor. Many changes, modifications, variations and other uses and applications of the subject invention will, however, become apparent to those skilled in the art after considering this specification and the accompanying drawing which disclose a preferred embodiment thereof. All such changes, modifications, variations and other uses and applications which do not depart from the spirit and scope of the invention are deemed to be covered by the invention which is limited only by the claims which follow.

We claim:

1. Short circuit detection apparatus, comprising:

a power MOSFET of a predetermined channel type having a source terminal, a drain terminal, and a gate terminal;

a load in series with the power MOSFET;

a voltage comparator having one end coupled to the source terminal of the power MOSFET and another end coupled to the drain terminal, the voltage comparator providing an output signal when the voltage between the source and drain terminals is higher than a predetermined voltage representing a short circuit in the load, the voltage comparator comprising:

(a) a first means for providing a Zener characteristic in series with a first current source, the first Zener characteristic providing means and the first current source being responsive to the source and drain terminals of the power MOSFET;

(b) a second MOSFET of a channel type opposite to that of the power MOSFET, the second MOSFET having a source terminal, a drain terminal, and a gate terminal, t he source terminal of the second MOSFET and the drain terminal of the power MOSFET being coupled to one end of the first current source, and the gate terminal of the second MOSFET being coupled to another end of the first current source;

(c) a second load in series with the second MOSFET; and (d) a first output terminal coupled to one end of the second load and a second output terminal coupled to another end of the second load.

2. A circuit according to claim 1, wherein said first means comprises an enhancement MOSFET having a gate terminal coupled to its drain terminal and its source terminal coupled to said first current source.

3. A circuit according to claim 2, wherein said first means comprises a Zener diode.

4. A circuit according to claim 1, further comprising:
a) a switch being coupled to the gate terminal and the source terminal of said second MOSFET, said switch being conductive when said power MOSFET is blocked, and
b) a second current source being coupled between said first means and a connection point of said first current source and the gate terminal of said second MOSFET.

5. A circuit according to claim 4, wherein said second load is in the form or a third current source.

6. A circuit according to claim 5, wherein said third current source comprises a depletion MOSFET, the depletion MOSFET having its gate terminal and its source terminal coupled to each other.

7. A circuit according to claim 1, further comprising:
a) a switch the ends of which being coupled to the gate terminal and the source terminal of said second MOSFET, wherein said switch becomes conducting when said power MOSFET is blocked, and
b) a second current source being coupled to the source terminal of said power MOSFET and said first means.

8. A circuit according to claim 7, wherein said second current source is formed by a depletion MOSFET, the gate terminal and the source terminal of which being coupled to each other.

9. A circuit according to claim 5, further comprising a Zener diode being connected in parallel to said third current source.

10. A circuit according to claim 1, wherein said first current source is in the form of a depletion MOSFET, the depletion MOSFET having its gate terminal and its source terminal coupled to each other.

* * * * *